United States Patent
Nikitin et al.

(10) Patent No.: US 12,300,643 B2
(45) Date of Patent: May 13, 2025

(54) SOLDER STOP FEATURE FOR ELECTRONIC DEVICES

(71) Applicant: Infineon Technologies AG, Neubiberg (DE)

(72) Inventors: Ivan Nikitin, Regensburg (DE); Adrian Lis, Regensburg (DE); Peter Scherl, Regensburg (DE); Achim Althaus, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 672 days.

(21) Appl. No.: 17/537,822

(22) Filed: Nov. 30, 2021

(65) Prior Publication Data

US 2023/0170316 A1     Jun. 1, 2023

(51) Int. Cl.
| | |
|---|---|
| *H01L 23/48* | (2006.01) |
| *H01L 23/00* | (2006.01) |
| *H01L 23/498* | (2006.01) |
| *H05K 1/11* | (2006.01) |
| *H05K 1/18* | (2006.01) |

(52) U.S. Cl.
CPC ........ *H01L 24/05* (2013.01); *H01L 23/49838* (2013.01); *H01L 24/04* (2013.01); *H05K 1/11* (2013.01); *H01L 23/49811* (2013.01); *H01L 24/06* (2013.01); *H01L 24/40* (2013.01); *H01L 2224/04034* (2013.01); *H01L 2224/05552* (2013.01); *H01L 2224/05556* (2013.01); *H01L 2224/0603* (2013.01); *H01L 2224/40475* (2013.01); *H05K 1/18* (2013.01); *H05K 2201/0939* (2013.01); *H05K 2201/10196* (2013.01); *H05K 2201/10363* (2013.01)

(58) Field of Classification Search
None
See application file for complete search history.

(56) References Cited

U.S. PATENT DOCUMENTS

| | | | |
|---|---|---|---|
| 9,018,742 B2* | 4/2015 | Nikitin | H01L 24/50 |
| | | | 257/E23.032 |
| 10,128,345 B2* | 11/2018 | Kato | H01L 24/73 |
| 11,272,617 B2* | 3/2022 | Kieslinger | H05K 3/0061 |
| 11,533,805 B2* | 12/2022 | Luu | H05K 1/0209 |
| 2019/0259925 A1* | 8/2019 | Francis | H01L 33/502 |
| 2022/0102299 A1* | 3/2022 | Lis | H01L 24/40 |
| 2023/0026022 A1* | 1/2023 | Nikitin | H01L 21/565 |

\* cited by examiner

*Primary Examiner* — Courtney L Smith
(74) *Attorney, Agent, or Firm* — Murphy, Bilak & Homiller, PLLC (57) ABSTRACT

Described are solder stop features for electronic devices. An electronic device may include an electrically insulative substrate, a metallization on the electrically insulative substrate, a metal structure attached to a first main surface of the metallization via a solder joint, and a concavity formed in a sidewall of the metallization. The concavity is adjacent at least part of the solder joint and forms a solder stop. A first section of the metal structure is spaced apart from both the metallization and solder joint in a vertical direction that is perpendicular to the first main surface of the metallization. A linear dimension of the concavity in a horizontal direction that is coplanar with the metallization is at least twice the distance by which the first section of the metal structure is spaced apart from the first main surface of the metallization in the vertical direction. Additional solder stop embodiments are described.

8 Claims, 8 Drawing Sheets

SOLDER STOP FEATURE FOR ELECTRONIC DEVICES

BACKGROUND

Various types of electronic devices utilize metal structures for various purposes such as electrical connections, current and/or voltage sensing, temperature sensing, heat transfer, etc. Such metal structures include but are not limited to shunts, thermistors, and metal clips. Solder joints are typically used to attach the metal structure to another metallization included in the electronic device. Solder creepage may interfere with the function of the metal structure and/or may result in electrical shorting. For example, in the case of a shunt for current and/or voltage sensing or a thermistor for temperature sensing, the shunt or thermistor may include a carefully designed region for providing a precise measurement. Solder creepage onto this region significantly distorts the measurement, creating measurement inaccuracy. In the case of a metal clip, solder creepage could result in a problematic electrical shorting between two nodes of a circuit.

Hence, there is a need to prevent solder creepage onto to metal structures such as shunts, thermistors, and metal clips used in electronic devices.

SUMMARY

According to an embodiment of an electronic device, the electronic device comprises: an electrically insulative substrate; a metallization on the electrically insulative substrate; a metal structure attached to a first main surface of the metallization via a solder joint; and a concavity formed in a sidewall of the metallization, wherein the concavity is adjacent at least part of the solder joint, wherein a first section of the metal structure is spaced apart from both the metallization and the solder joint in a vertical direction that is perpendicular to the first main surface of the metallization, wherein a linear dimension of the concavity in a horizontal direction that is coplanar with the metallization is at least twice the distance by which the first section of the metal structure is spaced apart from the first main surface of the metallization in the vertical direction.

According to another embodiment of an electronic device, the electronic device comprises: a substrate comprising an electrically insulative substrate and a patterned metallization on the electrically insulative substrate, the patterned metallization comprising a plurality of metallization sections that are separated from one another; a metal structure attached at a first end to a first metallization section of the patterned metallization via a first solder joint and attached at a second end to a second metallization section of the patterned metallization via a second solder joint; a first projection jutting out from the first metallization section and configured as a first contact; a second projection jutting out from the second metallization section and configured as a second contact; a first concavity formed in a sidewall of the first metallization section at opposing lateral sides of the first projection; and a second concavity formed in a sidewall of the second metallization section at opposing lateral sides of the second projection.

According to another embodiment of an electronic device, the electronic device comprises: an electrically insulative substrate; a metallization on the electrically insulative substrate; and a metal structure attached to a first main surface of the metallization via a first solder joint, wherein a first section of the metal structure is spaced apart from both the metallization and the first solder joint in a vertical direction that is perpendicular to the first main surface of the metallization, wherein a second section of the metal structure is connected to the first section of the metal structure at a first end of the second section, wherein the second section of the metal structure is attached to the metallization via the first solder joint at a second end of the second section opposite the first end, wherein the second section of the metal structure has a transition region over which the height of the second section increases in the vertical direction from a first height at the second end of the second section to a second height at the first end of the second section, wherein a surface of the transition region that faces the metallization has one or more grooves that prevent the first solder joint from reaching the first section of the metal structure.

According to an embodiment of a method of producing an electronic device, the method comprises: providing a substrate that comprises an electrically insulative substrate and a patterned metallization on the electrically insulative substrate, the patterned metallization comprising a plurality of metallization sections that are separated from one another; attaching a first end of a metal structure to a first metallization section of the patterned metallization via a first solder joint and a second end of the metal structure to a second metallization section of the patterned metallization via a second solder joint; forming a first projection that juts out from the first metallization section and configured as a first contact; forming a second projection that juts out from the second metallization section and configured as a second contact; forming a first concavity in a sidewall of the first metallization section at opposing lateral sides of the first projection; and forming a second concavity in a sidewall of the second metallization section at opposing lateral sides of the second projection.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a solder stop feature for electronic devices that utilize metal structures for various purposes such as electrical connections, current and/or voltage sensing, temperature sensing, heat transfer, etc. Such metal structures include but are not limited to shunts, thermistors, and metal clips. The solder stop feature prevents solder wetting with a targeted region of the metal structure. In the case of a shunt for current and/or voltage sensing or a thermistor for temperature sensing, the solder stop feature prevents solder wetting with a region carefully designed for providing a precise measurement. In the case of a metal clip, the solder stop feature prevents solder wetting that may otherwise result in a problematic electrical shorting between two nodes of a circuit. The solder stop feature may be formed in a metallization to which a metal structure is attached via a solder joint, to the metal structure itself, or to both the metallization and the metal structure.

Described next, with reference to the figures, are exemplary embodiments of the solder stop feature, electronic devices that utilize the solder stop feature, and methods of producing such electronic devices.

FIGS. 1A through 1E illustrate an embodiment of producing an electronic component. The electronic component may be designed, e.g., for use in a DC/AC inverter, a DC/DC converter, an AC/DC converter, a DC/AC converter, an AC/AC converter, or the like.

Figure 1A:
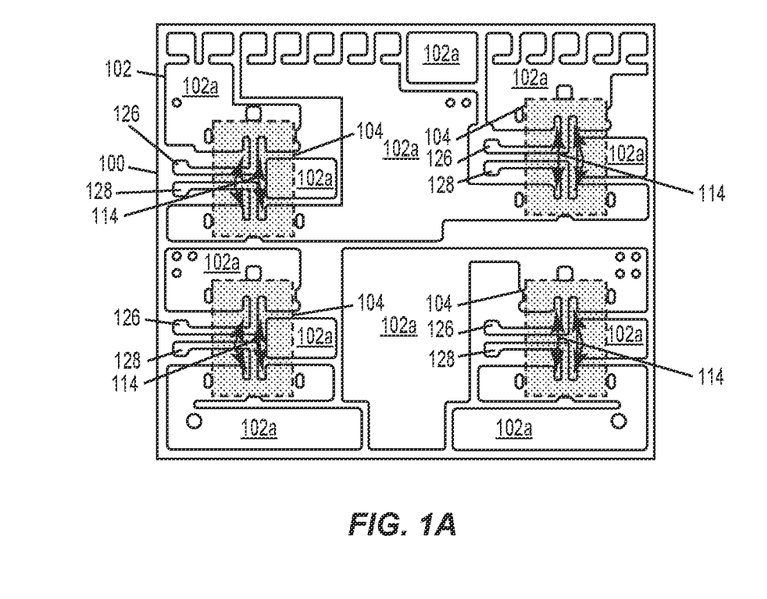
FIGS. 1A through 1E illustrate different views of an embodiment of producing an electronic component having a solder stop feature.

FIG. 1A shows an electrically insulative substrate 100 and a metallization 102 on the electrically insulative substrate 100. In one embodiment, the electrically insulative substrate 100 and the metallization 102 are part of a substrate such as a DCB (direct copper bonded) substrate, an AMB (active metal brazed) substrate, an IMS (insulated metal substrate), etc. In another embodiment, the metallization 102 is part of a leadframe. The metallization 102 may be a patterned metallization having metallization sections 102a that are separated from one another. In each case, one or more regions 104 of the metallization 102 are designated for attachment of a metal structure such as a shunt, thermistor, metal clip, etc.

Figure 1B:
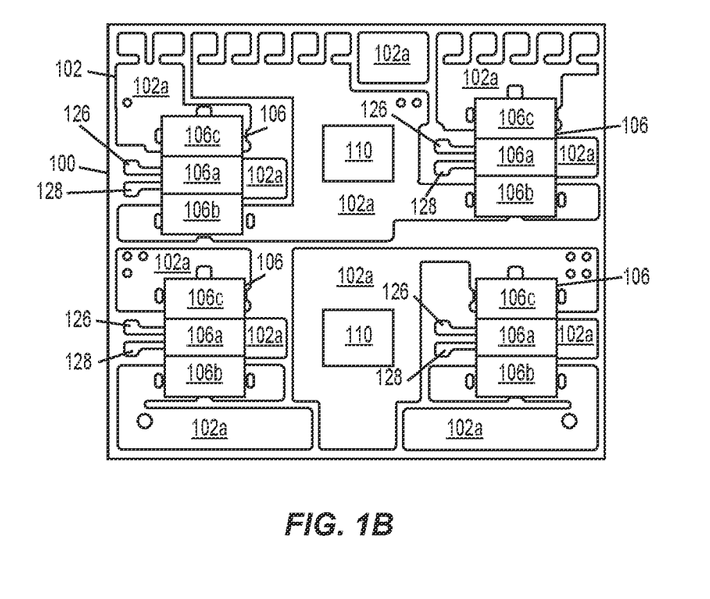

FIG. 1B shows the metallization 102 after attachment of a metal structure 106 to each designated region 104 of the metallization 102. Each metal structure 106 is attached to the corresponding designated region 104 of the metallization 102 via a solder joint 108 which are out of view in FIG. 1B. Other components such as semiconductor dies (chips) 110, passive components, etc. also may be attached to the metallization 102. Further connections may be made between the metallization 102 and the components 110 attached to the first main surface 112 of the metallization 102, e.g., such as wire bond connections, wire ribbon connections, metal clip connections, etc. After all connections are completed, the assembly may be molded and, e.g., singulated into separate molded modules in the case of batch processing.

According to the embodiment illustrated in FIGS. 1A and 1B, at least one concavity 114 is formed in the sidewall 116 of the metallization 102 at each region 104 designated for attachment of a metal structure 106. Each concavity 114 may extend completely through the metallization 102 in a vertical direction (z direction in FIGS. 1C-1E) that is perpendicular to the first main surface 112 of the patterned metallization 102 or instead may terminate at a depth within the metallization 102 that is less than the thickness 'T_metal' of the metallization 102.

Figure 1C:
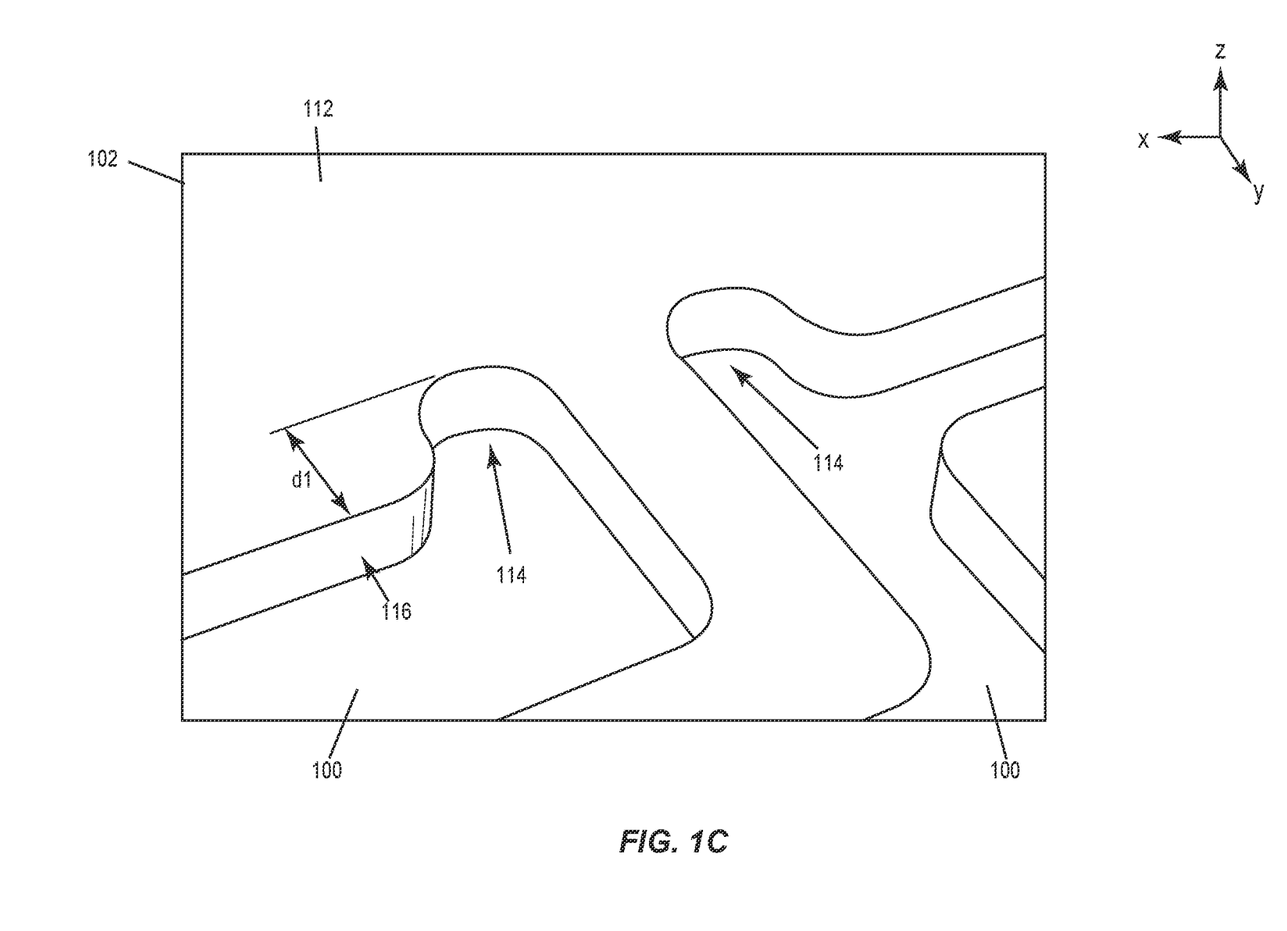

FIG. 1C illustrates a partial perspective view of a section of the metallization 102 in one region 104 designated for attachment of a metal structure 106, prior to attachment of the metal structure 106.

Figure 1D:
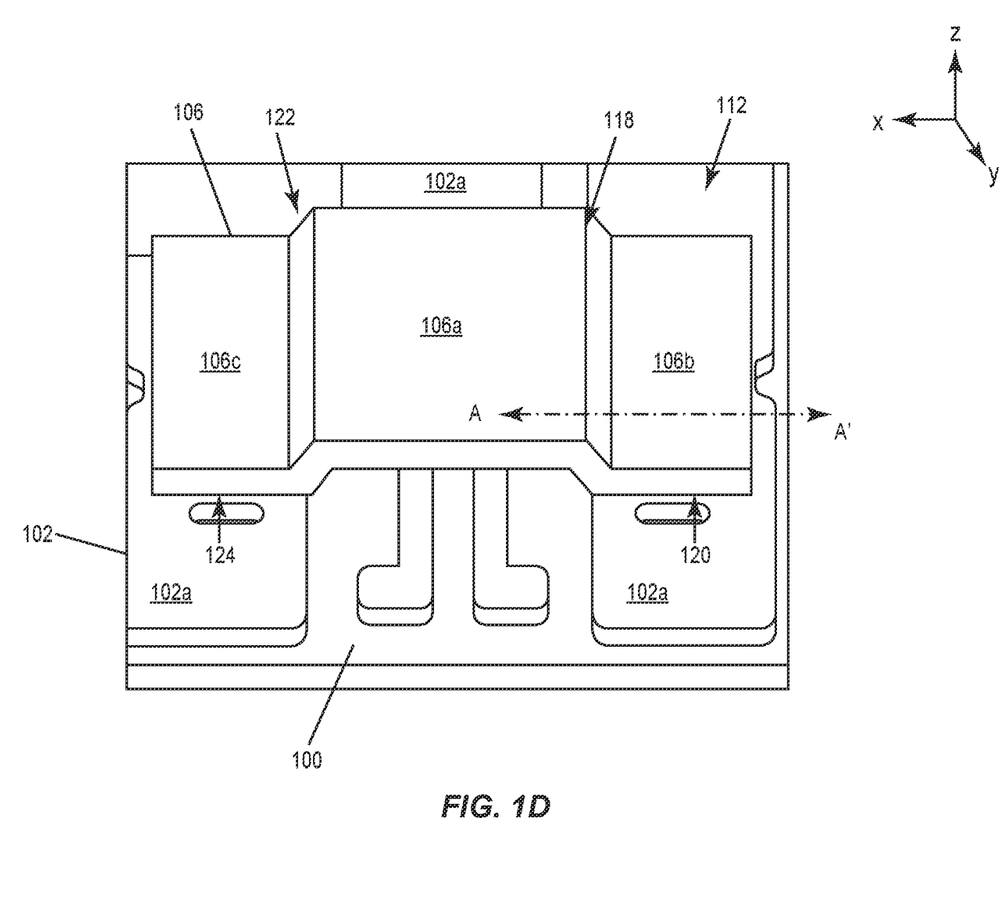

FIG. 1D illustrates a partial perspective view of the section of the metallization 102 after attachment of the metal structure 106.

Figure 1E:
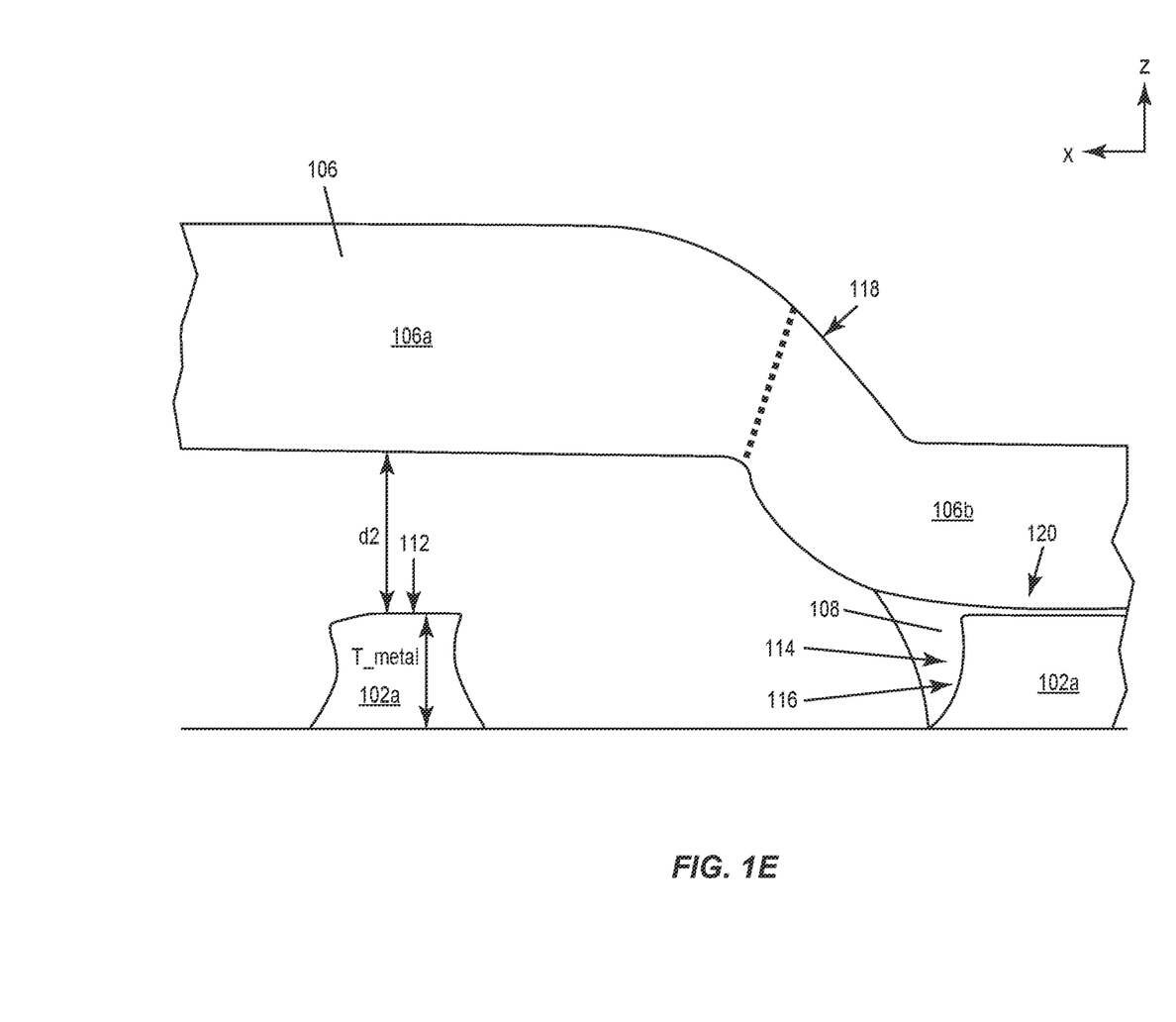

FIG. 1E illustrates a partial cross-sectional view of the metal structure 106 after attachment to the metallization 102, along the line labelled A-A' in FIG. 1D.

The metal structure 106 is attached to the first main surface 112 of the metallization 102 via two respective solder joints 108, one solder joint 108 at each end of the metal structure 106.

At least one concavity 114 is formed in the sidewall 116 of the metallization 102 in the region where each solder joint 108 is to be formed. Each concavity 114 is adjacent at least part of the corresponding solder joint 108 once the solder joint 108 is formed. The metal structure 106 attached to the metallization 102 by the solder joints 108 has a first section 106a that is spaced apart from both the metallization 102 and the corresponding solder joint 108 in a vertical direction (z direction in FIGS. 1C-1E) that is perpendicular to the first main surface 112 of the metallization 102.

A linear dimension 'd1' of the concavity 114 in a horizontal direction (y direction in FIGS. 1C-1D) that is coplanar with the first main surface 112 of the metallization 102 is at least twice the distance 'd2' by which the first section 106a of the metal structure 106 is spaced apart from the first main surface 112 of the metallization 102 in the vertical direction. That is, d1≥2*d2. In one embodiment, the metallization 102 is patterned by etching. According to this embodiment, the linear dimension d1 of the concavities 114 is about twice the thickness T_metal of the metallization 102. In another embodiment, the metallization 102 is patterned by stamping (punching). According to this embodiment, the linear dimension d1 of the concavities 114 is about equal to the thickness T_metal of the metallization 102.

A second section 106b of the metal structure 106 may be connected to the first section 106a of the metal structure 106 at a first end 118 of the second section 106b. The second section 106b of the metal structure 106 is attached to a section 102a of the metallization 102 via a solder joint 108 at a second end 120 of the second section 106b opposite the first end 118.

A third section 106c of the metal structure 106 is connected to an opposite end of the first section 106a of the metal structure 106 as the second section 106b, at a first end 122 of the third section 106. The third section 106c of the metal structure 106 is attached to a section 102a of the metallization 102 via another solder joint 108 at a second end 124 of the third section 106c opposite the first end 122. Accordingly, the second and third sections 106b, 106c of the metal structure 106 are attached to different sections 102a of the metallization 102 by respective solder joints 108 whereas the first section 106a of the metal structure 106 is spaced apart from the metallization 102 by a distance d2. As indicated by the oval shape in FIG. 1E, the concavities 114 formed in the sidewall 116 of the metallization 102 in the region of each solder joint 108 prevents solder wetting with the first section 106a of the metal structure 106. That is, during formation of the solder joints 108, the concavities 114 prevent liquified solder from creeping onto the first section 106a of the metal structure 106.

Figure 2A:
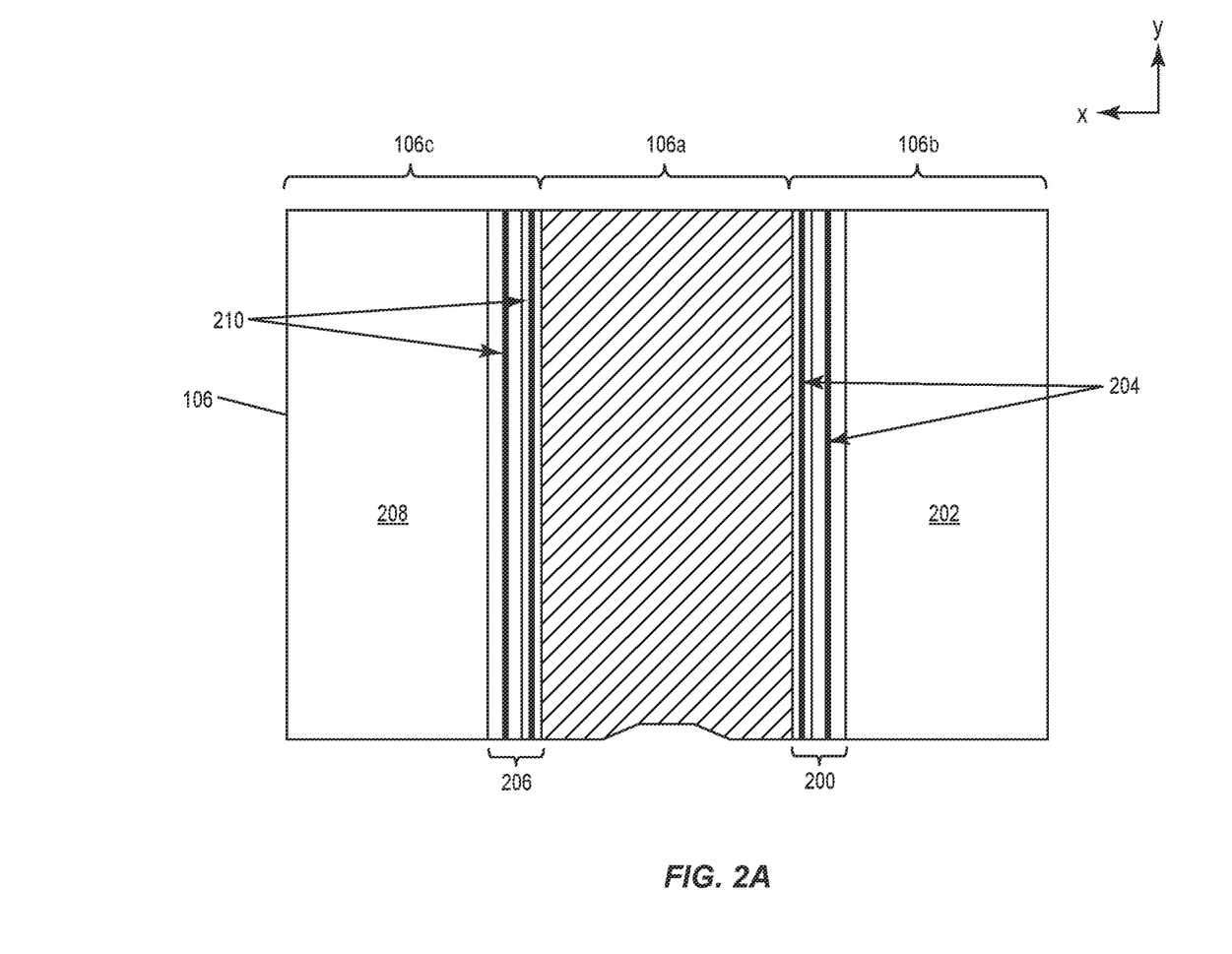
FIGS. 2A and 2B illustrate an embodiment of a metal structure having a solder stop feature.
Figure 2B:
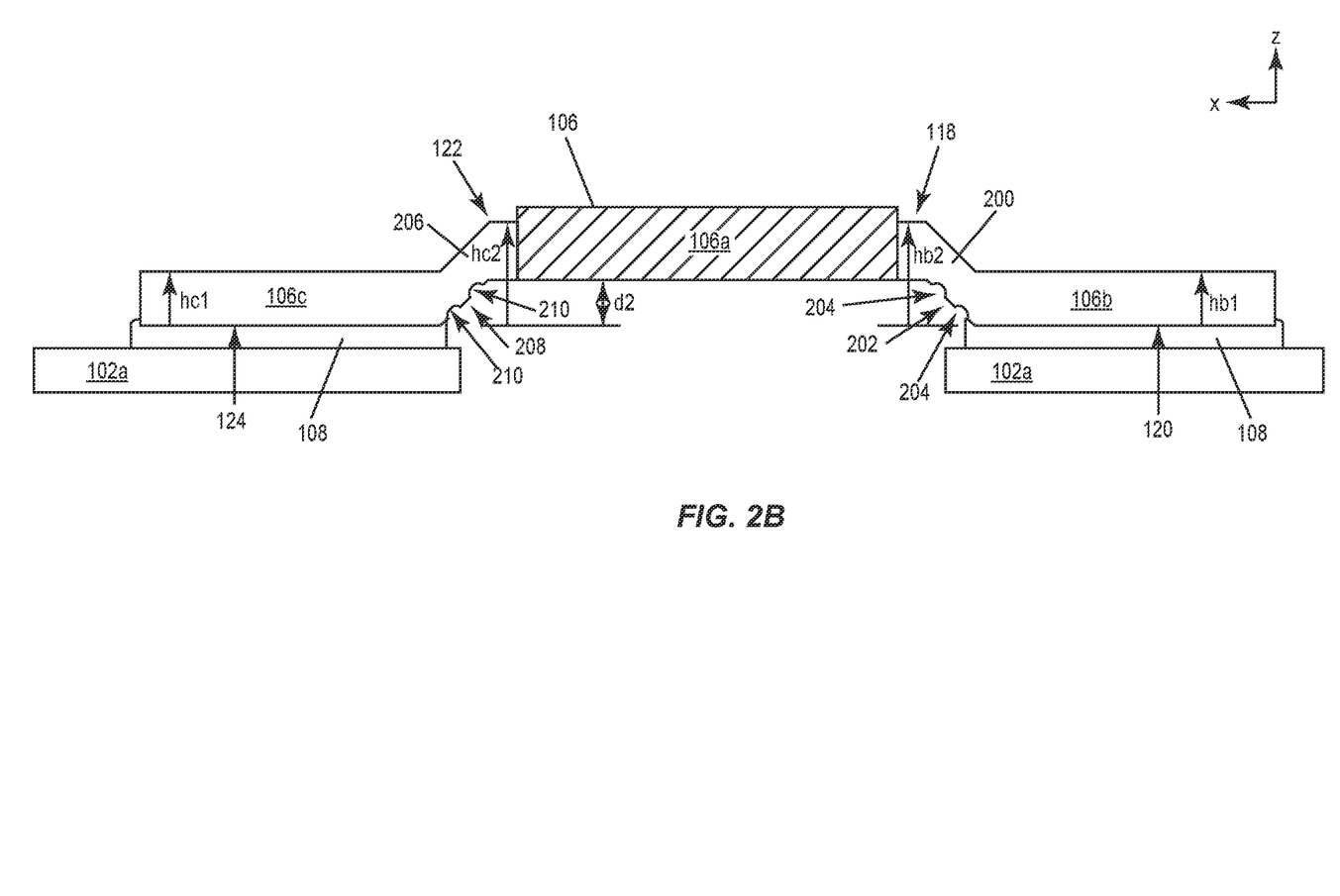

FIGS. 2A and 2B illustrate an embodiment according to which the metal structure 106 itself has a solder stop feature. Accordingly, the metallization 102 may have a solder stop feature, the metal structure 106 attached to the metallization 102 may have a solder stop feature, or both the metallization 102 and the metal structure 106 may each have a solder stop feature.

FIG. 2A shows a bottom plan view of the metal structure 106, i.e., the side of the metal structure 106 that will face the metallization 102 when production is complete. FIG. 2B shows a side view of the metal structure 106. According to the embodiment illustrated in FIGS. 2A and 2B, the second section 106b of the metal structure 106 has a transition region 200 over which the height of the second section 106b increases in the vertical direction (z direction in FIG. 2B) from a first height 'hb1' at the second end 120 of the second section 106b to a second height 'hb2' at the first end 118 of the second section 106b. The surface 202 of the transition region 200 that faces the metallization 102 has one or more grooves 204 that prevent the corresponding solder joint 108 from reaching the first section 106a of the metal structure 106.

The third section 106c of the metal structure 106 likewise has a transition region 206 over which the height of the third section 106c increases in the vertical direction (z direction in FIG. 2B) from a first height 'hc1' at the second end 124 of the third section 106c to a second height 'hc2' at the first end 122 of the third section 106c. The surface 208 of the transition region 206 of the third section 106c that faces the metallization 102 has one or more grooves 210 that prevent the corresponding solder joint 108 from reaching the first section 106c of the metal structure 106.

In one embodiment, at least one metal structure 106 attached to the metallization 102 is a shunt for current sensing. According to this embodiment, the first section 106a of the metal structure 106 comprises a different material than the second and third sections 106b, 106c of the metal structure 106 such that the first section 106a has a lower temperature coefficient between 20 and 60° C. compared to the second and third sections 106b, 106c. The different materials may be laser welded together to form the metal structure 106, for example. Such a laser-welded interface is indicated by the inclined dashed line in FIG. 1E. In one embodiment, the first section 106a comprises Zeranin (CuMn7Sn alloy) and the second and third sections 106b, 106c each comprise copper (Cu).

In the case of Cu as the material of the second and third sections 106b, 106c of the metal structure 106, the grooves 204, 210 may be formed by laser processing the Cu material. By introducing lasered solder stop stripes in front of and in parallel to the first section 106a of the metal structure 106 used for precise measurement, solder wetting of this area is prevented. Accordingly, the electrical resistance of the metal structure 106 is preserved as expected despite the use of solder to join the metal structure 106 to the metallization 102. The resulting solder joints 108 are more robust since the amount of solder may be increased, leading to a thicker bond line (e.g., 35 to 75 um thickness) which in turn decreases yield loss during production.

In the case of (temperature, current, voltage, etc.) sensing, FIGS. 1A and 1B show that a first projection 126 may jut out from a section 102a of the metallization 102 to which a first end of a metal structure 106 is attached. The first projection 126 is configured as a first contact meaning that the first projection 126 may be probed or permanently contacted. A second projection 128 juts out from another section 102a of the metallization 102 to which the (opposite) second end of the same metal structure 106 is attached. The second projection 128 is configured as a second contact. Accordingly, a sensor measurement may be obtained by probing or contacting the first and second projections 126, 128. As shown in FIG. 1A, a concavity 114 may be formed in the sidewall 116 of the metallization section 102a to which the first end of the metal structure 106 is attached, at opposing lateral sides of the first projection 126. Another concavity 114 may be formed in the sidewall 116 of the metallization section 102a to which the second end of the same metal structure 106 is attached, at opposing lateral sides of the second projection 128.

The concavities 114 prevent solder wetting between the solder joints 114 that attach the second and third sections 106b, 106c of the metal structure 106 to the respective metallization sections 102a with the first section 106c of the metal structure 106. In one embodiment, the linear dimension d1 of the concavities 114 in the horizontal direction (y direction in FIGS. 1A and 1B) that is coplanar with the first surface 112 of the metallization 102 is in a range of 500 μm to 700 μm. Separately or in combination, the concavities 114 formed at the opposing lateral sides of the first projection 126 may have the same shape as the concavities 114 formed at the opposing lateral sides of the second projection 128. Separately or in combination, the concavities 114 formed at the opposing lateral sides of the first projection 126 may have a rounded shape and/or the concavities 114 formed at the opposing lateral sides of the second projection 128 may have a rounded shape.

The embodiments described above in connection with FIGS. 1A through 1E apply the solder stop feature to a metallization 102 that is part of a substrate such as a DCB substrate, AMB substrate, IMS substrate, etc., or part of a leadframe. The solder stop feature may be applied to other types of metallization to which metal structures such as shunts, thermistors, metal clips, etc. are attached.

Figure 3A:
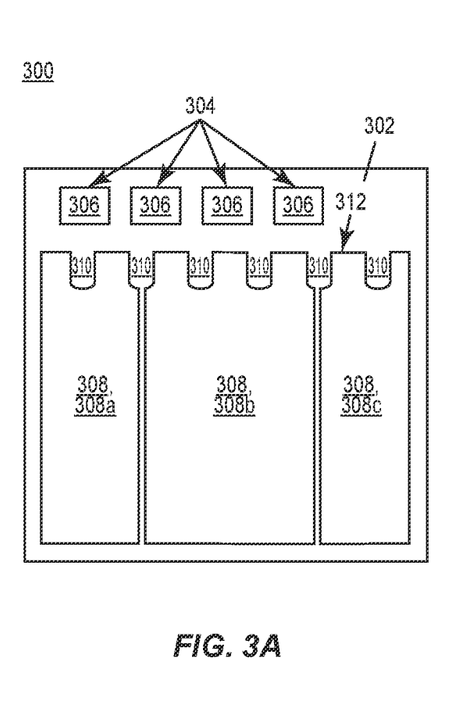
FIGS. 3A through 3C illustrate top plan views of different embodiments of semiconductor dies (chips) that have a solder stop feature.
Figure 3B:
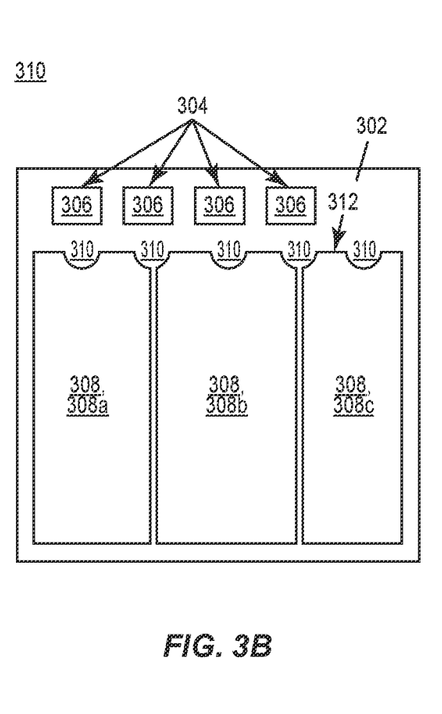
Figure 3C:
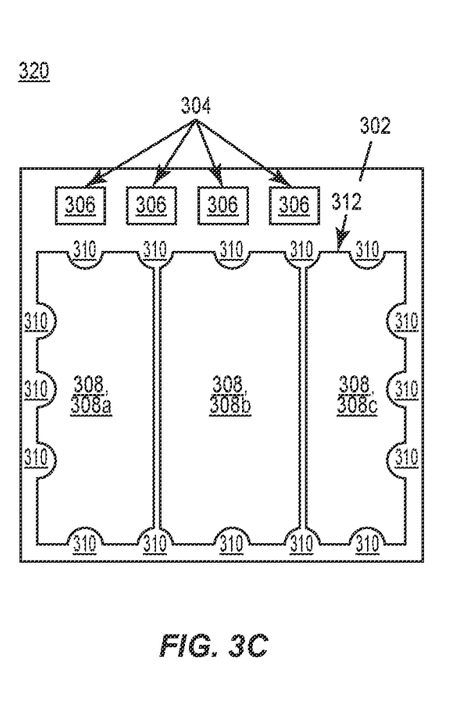

FIGS. 3A through 3C illustrate top plan views of different embodiments of semiconductor dies (chips) that use the solder stop feature. According to these embodiments, the electrically insulative substrate is an interlayer dielectric formed over a semiconductor substrate, the metallization is patterned into a plurality of contact pads that are separated from one another, and the concavities are formed in the sidewall of one or more of the contact pads to which a metal structure is attached via a solder joint.

FIG. 3A shows a top plan view of a semiconductor die 300. A passivation 302 such as polyimide covers the top side of the semiconductor die 300. Openings 304 in the passivation 302 expose underlying bond pads 306 and a patterned metallization 308. The metallization 308 is patterned into a plurality of contact pads 308a, 308b, 308c that are separated from one another. Wire bond connections (not shown in FIG. 3A) may be attached to the bond pads 306. A metal structure (not shown in FIG. 3A) such as a shunt, a thermistor, a metal clip, etc. is attached to one or more of the contact pads 308a, 308b, 308c of the patterned metallization 308 via one or more respective solder joints (not shown in FIG. 3A). To prevent solder wetting with a targeted region of the metal structure, concavities 310 are formed in the sidewall 312 of the patterned metallization 208 of the semiconductor die 300. The concavities 310 may be formed by etching the patterned metallization 208 in the region of the sidewall 312.

FIG. 3B shows a top plan view of another semiconductor die 320. The embodiment illustrated in FIG. 3B is similar to the embodiment illustrated in FIG. 3A. In FIG. 3B, the concavities 310 are shallower than the concavities 310 in FIG. 3A. In general, the concavities 310 may have any desired shape.

FIG. 3C shows a top plan view of another semiconductor die 330. The embodiment illustrated in FIG. 3C is similar to the embodiment illustrated in FIG. 3B. In FIG. 3C, the concavities 310 are formed along the entire perimeter of the metallization sidewall 312. In general, the concavities 310 may have formed along all or part of the perimeter of the metallization sidewall 312.

Figure 4A:
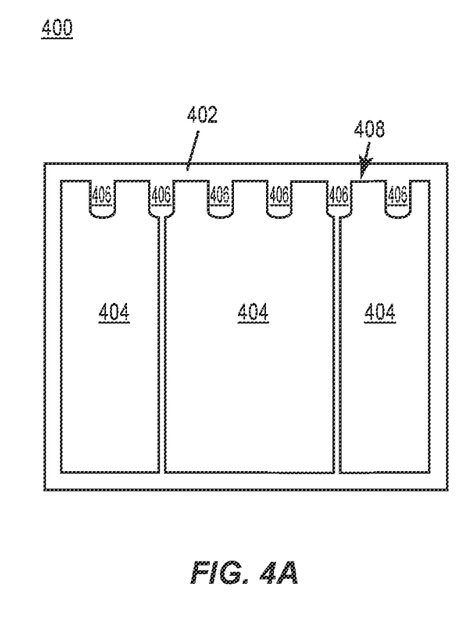
FIGS. 4A through 4C illustrate top plan views of different embodiments of molded semiconductor packages that have a solder stop feature.
Figure 4B:
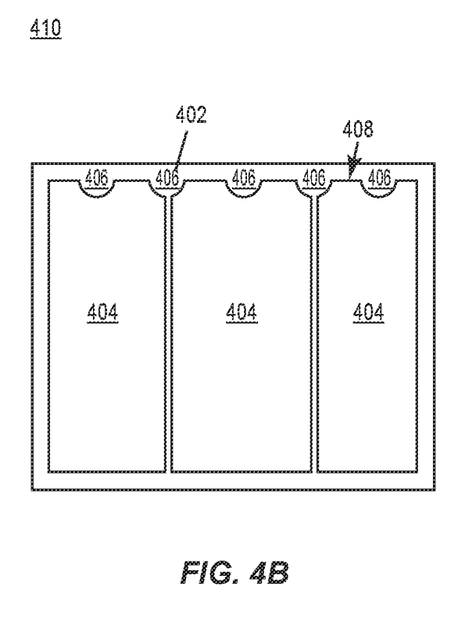
Figure 4C:
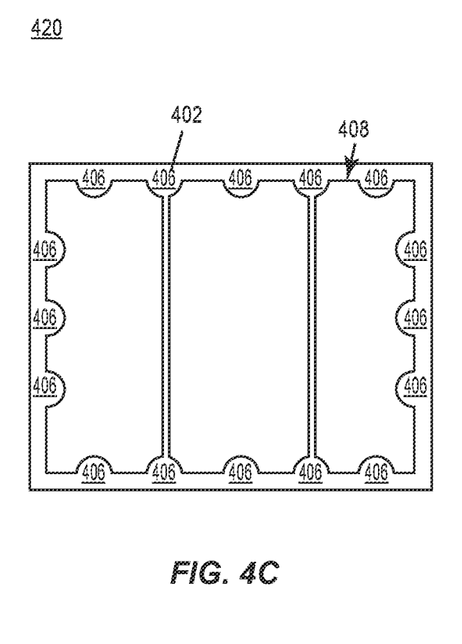

FIGS. 4A through 4C illustrate top plan views of different embodiments of molded semiconductor packages that use the solder stop feature. According to these embodiments, the electrically insulative substrate is a molding compound, at least part of the metallization is exposed from the molding compound, and the concavities are formed in the sidewall of the part of the metallization exposed from the molding compound.

FIG. 4A shows a plan view of a molded semiconductor package 400. One or more semiconductor dies (out of view) are embedded in a molding compound 402. Each semiconductor die embedded in the molding compound 402 is electrically connected to a patterned metallization 404 such as a leadframe. At least part of the patterned metallization 404 is exposed from the molding compound 402. A metal structure (not shown in FIG. 4A) such as a shunt, a thermistor, a metal clip, etc. is attached to the patterned metallization 404 via one or more respective solder joints (not shown in FIG. 4A). To prevent solder wetting with a targeted region of the metal structure, concavities 406 are formed in the sidewall 408 of the patterned metallization 404 of the molded semiconductor package 400. The concavities 406 may be formed by etching or stamping the patterned metallization 404 in the region of the sidewall 408.

FIG. 4B shows a plan view of another molded semiconductor package 410. The embodiment illustrated in FIG. 4B is similar to the embodiment illustrated in FIG. 4A. In FIG. 4B, the concavities 406 are shallower than the concavities 406 in FIG. 4A. In general, the concavities 406 may have any desired shape.

FIG. 4C shows a plan view of another molded semiconductor package 420. The embodiment illustrated in FIG. 4C is similar to the embodiment illustrated in FIG. 4B. In FIG. 4C, the concavities 406 are formed along the entire perimeter of the metallization sidewall 408. In general, the concavities 406 may have formed along all or part of the perimeter of the metallization sidewall 408.

Although the present disclosure is not so limited, the following numbered examples demonstrate one or more aspects of the disclosure.

Example 1. An electronic device, comprising: an electrically insulative substrate; a metallization on the electrically insulative substrate; a metal structure attached to a first main surface of the metallization via a solder joint; and a concavity formed in a sidewall of the metallization, wherein the concavity is adjacent at least part of the solder joint, wherein a first section of the metal structure is spaced apart from both the metallization and the solder joint in a vertical direction that is perpendicular to the first main surface of the metallization, wherein a linear dimension of the concavity in a horizontal direction that is coplanar with the metallization is at least twice the distance by which the first section of the metal structure is spaced apart from the first main surface of the metallization in the vertical direction.

Example 2. The electronic device of example 1, wherein the electrically insulative substrate is an interlayer dielectric formed over a semiconductor substrate, wherein the metallization is patterned into a plurality of contact pads that are separated from one another, and wherein the concavity is formed in the sidewall of one of the contact pads to which the metal structure is attached via the solder joint.

Example 3. The electronic device of example 1, wherein the electronic device is a molded semiconductor package, wherein the electrically insulative substrate is a molding compound, wherein at least part of the metallization is exposed from the molding compound, and wherein the concavity is formed in the sidewall of the part of the metallization exposed from the molding compound.

Example 4. The electronic device of example 1, wherein the electrically insulative substrate is a ceramic substrate, wherein the metallization is bonded to the ceramic substrate and patterned into a plurality of sections that are separated from one another, and wherein the concavity is formed in the sidewall of a section of the patterned metallization to which the metal structure is attached via the solder joint.

Example 5. The electronic device of any of examples 1 through 4, wherein the metal structure is a shunt, a thermistor, or a metal clip.

Example 6. The electronic device of any of examples 1 through 5, wherein a second section of the metal structure is connected to the first section of the metal structure at a first end of the second section, and wherein the second section of the metal structure is attached to the metallization via the solder joint at a second end of the second section opposite the first end.

Example 7. The electronic device of example 6, wherein the second section of the metal structure has a transition region over which the height of the second section increases in the vertical direction from a first height at the second end of the second section to a second height at the first end of the second section, and wherein a surface of the transition region that faces the metallization has one or more grooves that prevent the solder joint from reaching the first section of the metal structure.

Example 8. The electronic device of example 6 or 7, wherein the first section of the metal structure and the second section of the metal structure comprise different materials such that the first section of the metal structure has a lower temperature coefficient between 20 and 60° C. compared to the second section of the metal structure.

Example 9. An electronic device, comprising: a substrate comprising an electrically insulative substrate and a patterned metallization on the electrically insulative substrate, the patterned metallization comprising a plurality of metallization sections that are separated from one another; a metal structure attached at a first end to a first metallization section of the patterned metallization via a first solder joint and attached at a second end to a second metallization section of the patterned metallization via a second solder joint; a first projection jutting out from the first metallization section and configured as a first contact; a second projection jutting out from the second metallization section and configured as a second contact; a first concavity formed in a sidewall of the first metallization section at opposing lateral sides of the first projection; and a second concavity formed in a sidewall of the second metallization section at opposing lateral sides of the second projection.

Example 10. The electronic device of example 9, wherein a section of the metal structure between the first end and the second end is spaced apart from the patterned metallization in a vertical direction that is perpendicular to a first main surface of the patterned metallization, wherein the first concavity prevents wetting between the first solder joint and the section of the metal structure spaced apart from the patterned metallization in the vertical direction, and wherein the second concavity prevents wetting between the second solder joint and the section of the metal structure spaced apart from the patterned metallization in the vertical direction.

Example 11. The electronic device of example 9 or 10, wherein a section of the metal structure between the first end and the second end is spaced apart from the patterned metallization in a vertical direction that is perpendicular to the patterned metallization, wherein a linear dimension of the first concavity in a horizontal direction that is coplanar with the patterned metallization is at least twice the distance by which the section of the metal structure is spaced apart from the patterned metallization in the vertical direction, and wherein a linear dimension of the second concavity in the horizontal direction is at least twice the distance by which the section of the metal structure is spaced apart from the patterned metallization in the vertical direction.

Example 12. The electronic device of any of examples 9 through 11, wherein a linear dimension of the first concavity in a horizontal direction that is coplanar with the patterned metallization is about twice a thickness of the patterned metallization, and wherein a linear dimension of the second concavity in the horizontal direction is about twice the thickness of the patterned metallization.

Example 13. The electronic device of any of examples 9 through 11, wherein a linear dimension of the first concavity in a horizontal direction that is coplanar with the patterned metallization is about equal to a thickness of the patterned metallization, and wherein a linear dimension of the second concavity in the horizontal direction is about equal to the thickness of the patterned metallization.

Example 14. The electronic device of any of examples 9 through 13, wherein a linear dimension of the first concavity in a horizontal direction that is coplanar with the patterned metallization is in a range of 500 µm to 700 µm, and wherein a linear dimension of the second concavity in the horizontal direction is in a range of 500 µm to 700 µm.

Example 15. The electronic device of any of examples 9 through 14, wherein the first concavity terminates at a depth within the patterned metallization that is less than a thickness of the patterned metallization, and wherein the second concavity terminates at a depth within the patterned metallization that is less than a thickness of the patterned metallization.

Example 16. The electronic device of any of examples 9 through 14, wherein the first concavity extends completely through the patterned metallization in a vertical direction that is perpendicular to a first main surface of the patterned metallization, and wherein the second concavity extends completely through the patterned metallization in the vertical direction.

Example 17. The electronic device of any of examples 9 through 16, wherein the first concavity and the second concavity have a same shape.

Example 18. The electronic device of any of examples 9 through 17, wherein the first concavity and the second concavity each have a rounded shape.

Example 19. The electronic device of any of examples 9 through 18, wherein the metal structure is a shunt, a thermistor, or a metal clip.

Example 20. An electronic device, comprising: an electrically insulative substrate; a metallization on the electrically insulative substrate; and a metal structure attached to a first main surface of the metallization via a first solder joint, wherein a first section of the metal structure is spaced apart from both the metallization and the first solder joint in a vertical direction that is perpendicular to the first main surface of the metallization, wherein a second section of the metal structure is connected to the first section of the metal structure at a first end of the second section, wherein the second section of the metal structure is attached to the metallization via the first solder joint at a second end of the second section opposite the first end, wherein the second section of the metal structure has a transition region over which the height of the second section increases in the vertical direction from a first height at the second end of the second section to a second height at the first end of the second section, wherein a surface of the transition region that faces the metallization has one or more grooves that prevent the first solder joint from reaching the first section of the metal structure.

Example 21. The electronic device of example 20, wherein the first section of the metal structure and the second section of the metal structure comprise different materials such that the first section of the metal structure has a lower temperature coefficient between 20 and 60° C. compared to the second section of the metal structure.

Example 22. The electronic device of example 20 or 21, wherein: the metallization comprises a plurality of metallization sections that are separated from one another; the second section of the metal structure is attached to a first metallization section of the plurality of metallization sections via the first solder joint at the second end of the second section; a third section of the metal structure is connected to an opposite end of the first section of the metal structure as the second section of the metal structure, at a first end of the third section; the third section of the metal structure is attached to a second metallization section of the plurality of metallization sections via a second solder joint at a second end of the third section opposite the first end; the third section of the metal structure has a transition region over which the height of the third section increases in the vertical direction from a first height at the second end of the third section to a second height at the first end of the third section; and a surface of the transition region of the third section of the metal structure that faces the metallization has one or more grooves that prevent the second solder joint from reaching the first section of the metal structure.

Example 23. A method of producing an electronic device, the method comprising: providing a substrate that comprises an electrically insulative substrate and a patterned metallization on the electrically insulative substrate, the patterned metallization comprising a plurality of metallization sections that are separated from one another; attaching a first end of a metal structure to a first metallization section of the patterned metallization via a first solder joint and a second end of the metal structure to a second metallization section of the patterned metallization via a second solder joint; forming a first projection that juts out from the first metallization section and configured as a first contact; forming a second projection that juts out from the second metallization section and configured as a second contact; forming a first concavity in a sidewall of the first metallization section at opposing lateral sides of the first projection; and forming a second concavity in a sidewall of the second metallization section at opposing lateral sides of the second projection.

Example 24. The method of example 23, wherein each of the first projection, the second projection, the first concavity, and the second concavity are formed by etching, wherein a linear dimension of the first concavity in a horizontal direction that is coplanar with the patterned metallization is about twice a thickness of the patterned metallization, and wherein a linear dimension of the second concavity in the horizontal direction is about twice the thickness of the patterned metallization.

Example 25. The method of example 23, wherein each of the first projection, the second projection, the first concavity, and the second concavity are formed by stamping, wherein a linear dimension of the first concavity in a horizontal direction that is coplanar with the patterned metallization is about equal to a thickness of the patterned metallization, and wherein a linear dimension of the second concavity in the horizontal direction is about equal to the thickness of the patterned metallization.

Example 26. The method of any of examples 23 through 25, wherein the first concavity extends completely through the patterned metallization in a vertical direction that is perpendicular to a first main surface of the patterned metallization, and wherein the second concavity extends completely through the patterned metallization in the vertical direction.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device, comprising:
an electrically insulative substrate;
a metallization on the electrically insulative substrate;
a metal structure attached to a first main surface of the metallization via a solder joint; and
a concavity formed in a sidewall of the metallization,
wherein the concavity is adjacent at least part of the solder joint,
wherein a first section of the metal structure is spaced apart from both the metallization and the solder joint in a vertical direction that is perpendicular to the first main surface of the metallization,
wherein a linear dimension of the concavity in a horizontal direction that is coplanar with the metallization is at least twice the distance by which the first section of the metal structure is spaced apart from the first main surface of the metallization in the vertical direction.

2. The electronic device of claim 1, wherein the electrically insulative substrate is an interlayer dielectric formed over a semiconductor substrate, wherein the metallization is patterned into a plurality of contact pads that are separated from one another, and wherein the concavity is formed in the sidewall of one of the contact pads to which the metal structure is attached via the solder joint.

3. The electronic device of claim 1, wherein the electronic device is a molded semiconductor package, wherein the electrically insulative substrate is a molding compound, wherein at least part of the metallization is exposed from the molding compound, and wherein the concavity is formed in the sidewall of the part of the metallization exposed from the molding compound.

4. The electronic device of claim 1, wherein the electrically insulative substrate is a ceramic substrate, wherein the metallization is bonded to the ceramic substrate and patterned into a plurality of sections that are separated from one another, and wherein the concavity is formed in the sidewall of a section of the patterned metallization to which the metal structure is attached via the solder joint.

5. The electronic device of claim 1, wherein the metal structure is a shunt, a thermistor, or a metal clip.

6. The electronic device of claim 1, wherein a second section of the metal structure is connected to the first section of the metal structure at a first end of the second section, and wherein the second section of the metal structure is attached to the metallization via the solder joint at a second end of the second section opposite the first end.

7. The electronic device of claim 6, wherein the second section of the metal structure has a transition region over which the height of the second section increases in the vertical direction from a first height at the second end of the second section to a second height at the first end of the second section, and wherein a surface of the transition region that faces the metallization has one or more grooves that prevent the solder joint from reaching the first section of the metal structure.

8. The electronic device of claim 6, wherein the first section of the metal structure and the second section of the metal structure comprise different materials such that the first section of the metal structure has a lower temperature coefficient between 20 and 60° C. compared to the second section of the metal structure.

* * * * *